(12) United States Patent
Pan et al.

(10) Patent No.: US 9,715,160 B2
(45) Date of Patent: Jul. 25, 2017

(54) BARIUM TETRABORATE COMPOUND AND BARIUM TETRABORATE NON-LINEAR OPTICAL CRYSTAL, AND PREPARATION METHOD AND USE THEREOF

(71) Applicant: XINJIANG TECHNICAL INSTITUTE OF PHYSICS AND CHEMISTRY, CHINESE ACADEMY OF SCIENCES, Urumqi, Xinjiang (CN)

(72) Inventors: Shilie Pan, Xinjiang (CN); Zhaohui Chen, Xinjiang (CN)

(73) Assignee: Xinjiang Technical Institute of Physics and Chemistry, Chinese Academy of Sciences, Xinjiang (CN)

( * ) Notice: Subject to any disclaimer, the term of this patent is extended or adjusted under 35 U.S.C. 154(b) by 0 days.

(21) Appl. No.: 14/891,936

(22) PCT Filed: Jan. 23, 2014

(86) PCT No.: PCT/CN2014/071237
§ 371 (c)(1),
(2) Date: Nov. 17, 2015

(87) PCT Pub. No.: WO2014/187167
PCT Pub. Date: Nov. 27, 2014

(65) Prior Publication Data
US 2016/0130723 A1    May 12, 2016

(30) Foreign Application Priority Data
May 24, 2013 (CN) .......................... 2013 1 0197383

(51) Int. Cl.
*G02F 1/35* (2006.01)
*C30B 19/02* (2006.01)
(Continued)

(52) U.S. Cl.
CPC .......... *G02F 1/3551* (2013.01); *C01B 35/126* (2013.01); *C30B 15/00* (2013.01);
(Continued)

(58) Field of Classification Search
CPC ........ G02F 1/3551; C30B 15/00; C30B 19/02
See application file for complete search history.

(56) References Cited

U.S. PATENT DOCUMENTS

| 8,743,922 B2* | 6/2014 | Smeeton | ................ G02F 1/377 372/21 |
| 2012/0188630 A1* | 7/2012 | Pan | .......................... C30B 9/06 359/329 |

(Continued)

OTHER PUBLICATIONS

Block, S. et al. "The Crystal Structure of Barium Tetraborate BaO.2B₂O₃," Acta Cryst., vol. 19, Sep. 30, 1965, pp. 297-300.
(Continued)

*Primary Examiner* — Daniel Petkovsek
(74) *Attorney, Agent, or Firm* — Lewis Roca Rothgerber Christie LLP

(57) ABSTRACT

The present invention relates to a barium tetraborate compound and a barium tetraborate non-linear optical crystal, and a preparation method and use thereof, wherein the chemical formulae of the barium tetraborate compound and the non-linear optical crystal thereof are both $BaB_4O_7$, with a molecular weight of 292.58; the barium tetraborate non-linear optical crystal has a non-centrosymmetric structure, which belongs to a hexagonal system, and has a space group $P6_5$ and lattice parameters of a=6.7233(6) Å, c=18.776(4) Å, V=735.01(17) Å³, and Z=6, wherein the powder frequency-doubled effect thereof is two times that of KDP ($KH_2PO_4$), and the ultraviolet cut-off edge is lower than 170 nm. The barium tetraborate compound is synthesized by a solid-phase reaction method; the barium tetraborate non-linear optical crystal is grown by a high-temperature molten solu-
(Continued)

tion method; and the crystal has a moderate mechanical hardness, is easy to cut, polish and store, and is widely applicable in the non-linear optics of a double-frequency doubling generator, an upper frequency converter, a lower frequency converter or an optical parameter oscillator etc.

6 Claims, 1 Drawing Sheet

(51) Int. Cl.
    *G02F 1/355*     (2006.01)
    *C30B 15/00*     (2006.01)
    *C01B 35/12*     (2006.01)
    *C30B 29/22*     (2006.01)
    *C30B 29/10*     (2006.01)
    *C30B 19/12*     (2006.01)

(52) U.S. Cl.
    CPC .............. *C30B 19/02* (2013.01); *C30B 29/22* (2013.01); *C30B 19/12* (2013.01); *C30B 29/10* (2013.01)

(56) References Cited

U.S. PATENT DOCUMENTS

| | | | |
|---|---|---|---|
| 2012/0189524 A1* | 7/2012 | Pan | ........................... C30B 9/12 423/277 |
| 2016/0145769 A1* | 5/2016 | Pan | ........................... C30B 7/10 423/277 |

OTHER PUBLICATIONS

International Search Report with English Translation dated Apr. 24, 2014 for corresponding Application No. PCT/CN2014/071237, 2 pages.

* cited by examiner

BARIUM TETRABORATE COMPOUND AND BARIUM TETRABORATE NON-LINEAR OPTICAL CRYSTAL, AND PREPARATION METHOD AND USE THEREOF

CROSS-REFERENCE TO RELATED APPLICATION(S)

This application is a National Phase Patent Application and claims priority to and the benefit of International Application Number PCT/CN2014/071237, filed on Jan. 23, 2014, which claims priority to Chinese Patent Application Number 201310197383.1, filed on May 24, 2013, the entire content of all of which are incorporated herein by reference.

FIELD OF THE INVENTION

The present invention refers to a barium tetraborate compound and a barium tetraborate non-linear optical crystal, and preparation method and use thereof.

BACKGROUND OF THE INVENTION

In the laser technology, non-linear optical devices such as second harmonic generator, upper or lower frequency converters, optical parametric oscillator and the like can be produced by use of non-linear optical effect of crystals. The laser obtained directly by using a laser crystal is limited in wave band; furthermore, there is still lack of non-linear optical crystal of excellent performance in the deep ultraviolet band.

At present, the ultraviolet non-linear optical materials include: BBO (β-BBO) crystal, LBO ($LiB_3O_5$) crystal, CBO ($CsB_3O_5$) crystal, CLBO ($CsLiB_6O_{10}$) crystal and KBBF ($KBe_2BO_3F_2$) crystal. Crystal growth techniques for these materials have become more mature, but there are still some significant deficiencies, for example, the crystal is deliquescent and has a long growth cycle; although KBBF has a ultraviolet cut-off edge of 155 nm, its layer-by-layer growth habit hinders the further application. Therefore, searching for new non-linear optical materials in deep ultraviolet band is still an important and arduous task.

From the perspective of exploring non-linear optical materials, prerequisites for industrialization and application are stable compound, simple system and stable performances. Based on the strong frequency-doubled effect of β-BBO and short cut-off edge of $PbB_4O_7$ and $SrB_4O_7$, it is of very important significance to explore new compounds in the Ba—B—O system.

In recently years, in the development of various types of novel non-linear optical crystals, the researchers around the world are still trying to explore new non-linear optical crystals, which have a simple system and are easy to prepare and stable in performance, to find out practical non-linear optical crystals which can convert a laser at a limited wavelength into a laser in a new band by use of frequency-doubled effect, wave-mixing effect, optical parametric oscillation and other non-liner optical effects. Such a technique can fill in the spectrum blank in wavelengths of the lasers emitter by various laser devices and prompt more extensive application of the laser devices.

SUMMARY OF THE INVENTION

The objectives of the present invention are to provide a barium tetraborate compound and a barium tetraborate non-linear optical crystal, and preparation method and use thereof. The compound has a chemical formula of $BaB_4O_7$ and a molecular weight of 292.58, and it has a non-centrosymmetric structure, belongs to a hexagonal crystal system, and has a space group $P6_5$, with lattice parameters of a=6.7233(6) Å, b=6.7233(6) Å, c=18.776(4) Å, V=735.01(17) Å$^3$ and Z=6.

Another objective of the present invention is to provide a barium tetraborate non-linear optical crystal having a chemical formula of $BaB_4O_7$ and a molecular weight of 292.58. It is a compound having a non-centrosymmetric structure, belongs to a hexagonal crystal system, and has a space group $P6_5$, with lattice parameters of a=6.7233(6) Å, c=18.776(4) Å, V=735.01(17) Å$^3$ and Z=6.

Another objective of the present invention is to provide a preparation method of the barium tetraborate non-linear optical crystal, wherein the crystal is grown by a high temperature solution method.

Yet another objective of the present invention is to provide a use of the barium tetraborate non-linear optical crystal, wherein the crystal can be used to produce frequency doubling generator, upper frequency converter, lower frequency converter, or optical parametric oscillator.

The technical schemes of the present invention are described as follows:

The barium tetraborate compound provided in the present invention is the single-phase polycrystalline powder of $BaB_4O_7$, has a chemical formula of $BaB_4O_7$ and a molecular weight of 292.58. The single-phase polycrystalline powder of $BaB_4O_7$ has a non-centrosymmetric structure, belongs to a hexagonal crystal system, and has a space group $P6_5$, with lattice parameters of a=6.7233(6) Å, c=18.776(4) Å, V=735.01(17) Å$^3$ and Z=6. The compound is prepared by a solid-phase reaction method.

The barium tetraborate non-linear optical crystal provided in the present invention has a chemical formula of $BaB_4O_7$ and a molecular weight of 292.58, is a non-centrosymmetric compound, belongs to a hexagonal crystal system, and has a space group $P6_5$, with lattice parameters of a=6.7233(6) Å, c=18.776(4) Å, V=735.01(17) Å$^3$ and Z=6.

The preparation method of the barium tetraborate non-linear optical crystal provided in the present invention uses a high temperature solution method to make the crystal growing, and is conducted specifically according to the following steps:

a. The single-phase polycrystalline powder of the barium tetraborate prepared by the solid-phase reaction method is mixed with a flux, the mixture is heated to 720-820° C. at a rate of 1-50° C./h and held at this temperature for 1-100 hours to obtain a mixed melt liquid, which is then cooled to 650-750° C. to obtain a mixed melt liquid of barium tetraborate and flux;

b. The mixed melt liquid obtained in Step (a) is slowly cooled to room temperature at a rate of 0.5-10° C./h, allowing for crystallization to obtain a seed crystal, or using the platinum wire suspension method during cooling to obtain a small crystal as the barium tetraborate seed crystal;

c. The seed crystal obtained in Step (b) is fixed to a seed crystal rod and descended from the top of a crystal growing furnace; the seed crystal is preheated for 5-60 minutes, and then descended underneath the mixed melt liquid of barium tetraborate and flux to allow for meltback, the mixed melt liquid is held at the temperature for 5-60 minutes, and then cooled to 640-740° C.;

d. The mixed melt liquid is slowly cooled down at a rate of 0.1-5° C./day, the seed crystal rod is rotated at a rotation speed of 0-100 rpm to allow for crystal growth; when the monocrystal is grown to a desired size, the crystal is drawn out of the liquid surface, and cooled to room temperature at a rate of 1-100° C./h; the crystal is then taken out from the furnace to obtain a barium tetraborate non-linear optical crystal.

In Step (a), the barium-containing compound of the barium tetraborate compound is $BaCO_3$, $Ba(OH)_2$, $BaO$, $Ba(NO_3)_2$ or $Ba(HCO_3)_2$.

In Step (a), the flux is $PbF_2$—$H_3BO_3$, $BaF_2$—$H_3BO_3$, $NaF$—$H_3BO_3$, $PbO$—$H_3BO_3$ or $PbO$—$PbF_2$.

In Step (a), the molar ratio of the barium tetraborate compound to the flux is 1:1-6.

In said flux $PbF_2$—$H_3BO_3$, $BaF_2$—$H_3BO_3$, $NaF$—$H_3BO_3$ and $PbO$—$H_3BO_3$, the molar ratio of $PbF_2$, $BaF_2$, $NaF$ or $PbO$ to $H_3BO_3$ is 1-6:1-4, and in the flux $PbO$—$PbF_2$, the molar ratio of $PbO$ to $PbF_2$ is 1-3:1-4.

In Step (c), the seed crystal is fixed to the seed crystal rod in any orientation.

The use of the barium tetraborate non-linear optical crystal provided in the present invention is to use the crystal to prepare frequency doubling generator, upper frequency converter, lower frequency converter or optical parametric oscillator.

The barium tetraborate compound provided in the present invention has a chemical formula of $BaB_4O_7$, which is prepared by the solid-phase reaction method according to the following chemical reaction equations:

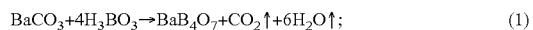

$$BaCO_3 + 4H_3BO_3 \rightarrow BaB_4O_7 + CO_2\uparrow + 6H_2O\uparrow; \quad (1)$$

$$Ba(OH)_2 + 4H_3BO_3 \rightarrow BaB_4O_7 + 7H_2O\uparrow; \quad (2)$$

$$BaO + 4H_3BO_3 \rightarrow BaB_4O_7 + 6H_2O\uparrow; \quad (3)$$

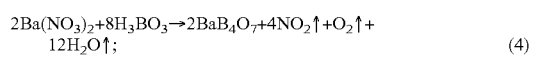

$$2Ba(NO_3)_2 + 8H_3BO_3 \rightarrow 2BaB_4O_7 + 4NO_2\uparrow + O_2\uparrow + 12H_2O\uparrow; \quad (4)$$

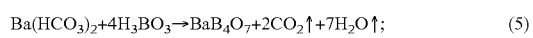

$$Ba(HCO_3)_2 + 4H_3BO_3 \rightarrow BaB_4O_7 + 2CO_2\uparrow + 7H_2O\uparrow; \quad (5)$$

$$BaCO_3 + 2B_2O_3 \rightarrow BaB_4O_7 + CO_2\uparrow; \quad (6)$$

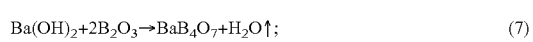

$$Ba(OH)_2 + 2B_2O_3 \rightarrow BaB_4O_7 + H_2O\uparrow; \quad (7)$$

$$BaO + 2B_2O_3 \rightarrow BaB_4O_7; \quad (8)$$

$$2Ba(NO_3)_2 + 4B_2O_3 \rightarrow 2BaB_4O_7 + 4NO_2\uparrow + O_2\uparrow; \quad (9)$$

$$Ba(HCO_3)_2 + 2B_2O_3 \rightarrow BaB_4O_7 + 2CO_2\uparrow + H_2O\uparrow; \quad (10)$$

The barium tetraborate non-linear optical crystal provided in the present invention has a chemical formula of $BaB_4O_7$ and a molecular weight of 292.58. The crystal is a non-centrosymmetric compound, belongs to a hexagonal crystal system, has a space group $P6_5$, with lattice parameters of $a=6.7233(6)$ Å, $c=18.776(4)$ Å, $V=735.01(17)$ Å$^3$ and $Z=6$, and has a powder frequency-doubled effect of about 2 times as much as that of KDP ($KH_2PO_4$) and a ultraviolet cutoff edge of about 170 nm.

The preparation method of the barium tetraborate non-linear optical crystal in the present invention uses a high temperature solution method to make the barium tetraborate non-linear optical crystal growing, has advantages in simple operation, fast growth, low cost and easy to obtain crystals in larger size, etc.

The crystal obtained in the present invention has advantages in wider transmission waveband, higher hardness, good mechanical performance, not easy to break down or become deliquescent, easy to process and store, and the like. Using the non-linear optical device made of the barium tetraborate non-linear optical crystal of the present invention, with a Q-switched Nd:YAG laser generator as light source, when the incident light is an infrared light at a wavelength of 1,064 nm, then the output light is a green laser at a wavelength of 532 nm, the laser intensity of which is equivalent to twice of that of KDP ($KH_2PO_4$).

EXAMPLES

Figure 1:
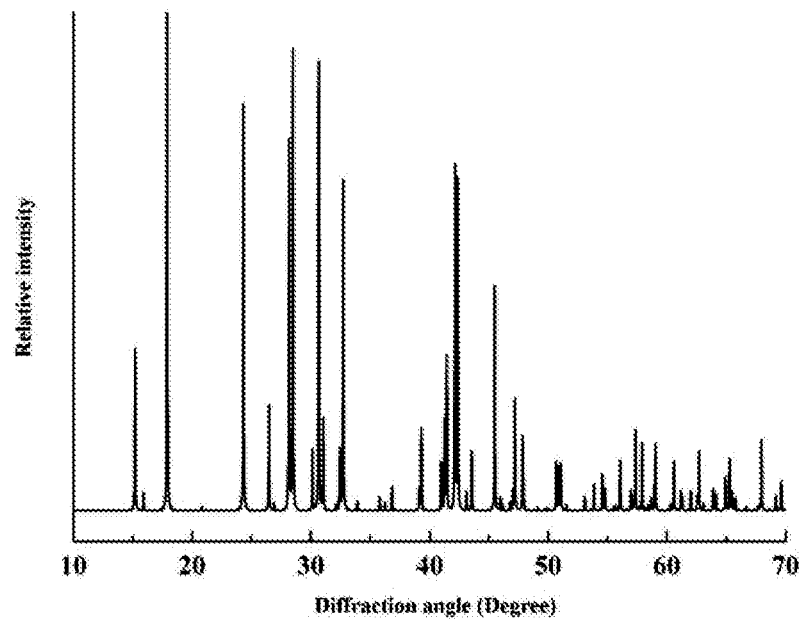
FIG. 1 is an X-ray diffraction pattern of the barium tetraborate compound of the present invention, which is the phase characteristic profile analysis of the barium tetraborate compound. Each compound has a unique XRD profile. After the barium tetraborate compound of the present invention is subjected to qualitative analysis, the peak intensity of the XRD profile shown in FIG. 1 corresponds to the total number of electrons in atoms, the greater number of electrons, the stronger peak intensity; the diffraction angle of the XRD profile corresponds to the distance between atomic layers, large distance between atomic layers corresponding to low angle while small distance corresponding to high angle.

The present invention will be described in details hereinafter in combination of the accompanying drawings.

Example 1

The $BaB_4O_7$ compound was prepared according to the reaction equation:

$$BaCO_3 + 4H_3BO_3 \rightarrow BaB_4O_7 + CO_2\uparrow + 6H_2O\uparrow$$

$BaCO_3$ and $H_3BO_3$ were placed in a mortar at a molar ratio of 1:4, and then mixed and ground carefully. The mixture was charged into a Φ100 mm×100 mm open-mouth corundum crucible which was then loaded into a muffle furnace. The muffle furnace was heated to 500° C. slowly, held at this temperature for 24 hours and cooled to room temperature. The mixture was taken out and ground carefully, and then compacted and placed back to the muffle furnace, which was heating to 780° C. and held at this temperature for 72 hours. The single-phase polycrystalline powder of the completely sintered barium tetraborate compound was obtained after grinding and then taken out. The product was subjected to X-ray assay to get a X-ray profile in correspondence with the X-ray profile of the barium tetraborate in a monocrystal structure.

The barium tetraborate $BaB_4O_7$ compound synthesized was mixed with a flux $PbF_2$—$H_3BO_3$ at a molar ratio of $BaB_4O_7$:$PbF_2$—$H_3BO_3$—1:1. The mixture was charged into a Φ60 mm×60 mm open-mouth platinum crucible. The platinum crucible was heated to 800° C., held at this temperature for 1 hour, and then cooled to 740° C. to obtain a mixed melt liquid of barium tetraborate and flux, wherein the molar ratio of the flux was $PbF_2$:$H_3BO_3$=1:2.

The mixed melt liquid obtained was slowly cooled to room temperature at a rate of 0.5° C./h, allowing for crystallization to obtain a small crystal as the barium tetraborate seed crystal.

The seed crystal obtained was fixed to a seed crystal rod in any orientation and descended from the top of a crystal growing furnace. The seed crystal was preheated for 5 minutes, and then descended underneath the surface of the mixed melt liquid of barium tetraborate and flux. The mixed melt liquid was held at the temperature for 5 minutes and then quickly cooled to 730° C.

The mixed melt liquid was slowly cooled down at a rate of 5° C./day. When the monocrystal stopped growing, the crystal was drawn out of the liquid surface, and cooled to room temperature at a rate of 1° C./h. The crystal was then taken out from the furnace to obtain a barium tetraborate $BaB_4O_7$ non-linear optical crystal at a size of 24 mm×18 mm×15 mm.

The barium-containing compound can be substituted by $Ba(OH)_2$, $BaO$, $Ba(NO_3)_2$ or $Ba(HCO_3)_2$, while boric acid can be substituted by boron trioxide.

Example 2

The $BaB_4O_7$ compound was prepared according to the reaction equation:

$$Ba(OH)_2 + 4H_3BO_3 \rightarrow BaB_4O_7 + 7H_2O\uparrow$$

and the specific operation as described in Example 1.

The barium tetraborate $BaB_4O_7$ compound synthesized was mixed with a flux $BaF_2$—$H_3BO_3$ at a molar ratio of $BaB_4O_7$:$BaF_2$—$H_3BO_3$=1:2. The mixture was charged into a Φ80 mm×80 mm open-mouth platinum crucible. The platinum crucible was heated to 820° C., held at this temperature for 20 hours, and then cooled to 750° C. to obtain a mixed melt liquid of barium tetraborate and flux, wherein the molar ratio of the flux was $BaF_2$:$H_3BO_3$=1:4.

The mixed melt liquid obtained was slowly cooled to room temperature at a rate of 10° C./h. The platinum wire suspension method was used during cooling to obtain a small crystal as the barium tetraborate $BaB_4O_7$ seed crystal.

The seed crystal obtained was fixed to a seed crystal rod in any orientation and descended from the top of a crystal growing furnace. The seed crystal was preheated for 60 minutes, and then descended underneath the surface of the mixed melt liquid of barium tetraborate and flux. The mixed melt liquid was held at the temperature for 30 minutes and then quickly cooled to 740° C.

The mixed melt liquid was slowly cooled down at a rate of 0.1° C./day. The seed crystal rod was rotated at a rotation speed of 30 rpm to allow for crystal growth. When the monocrystal stopped growing, the crystal was drawn out of the liquid surface, and cooled to room temperature at a rate of 100° C./h. The crystal was then taken out from the furnace to obtain a barium tetraborate $BaB_4O_7$ non-linear optical crystal at a size of 35 mm×24 mm×20 mm.

The barium-containing compound can be substituted by $BaCO_3$, $BaO$, $Ba(NO_3)_2$ or $Ba(HCO_3)_2$, while boric acid can be substituted by boron trioxide.

Example 3

The $BaB_4O_7$ compound was prepared according to the reaction equation:

$$BaO + 4H_3BO_3 \rightarrow BaB_4O_7 + 6H_2O\uparrow$$

and the specific operation as described in Example 1.

The barium tetraborate $BaB_4O_7$ compound synthesized was mixed with a flux $NaF$—$H_3BO_3$ at a molar ratio of $BaB_4O_7$:$NaF$—$H_3BO_3$=1:3. The mixture was charged into a Φ100 mm×100 mm open-mouth platinum crucible. The platinum crucible was heated to 750° C., held at this temperature for 50 hours, and then cooled to 700° C. to obtain a mixed melt liquid of barium tetraborate and flux, wherein the molar ratio of the flux was $NaF$:$H_3BO_3$=4:1.

The mixed melt liquid obtained was slowly cooled to room temperature at a rate of 3° C./h, allowing for crystallization to obtain a small crystal as the barium tetraborate $BaB_4O_7$ seed crystal.

The seed crystal obtained was fixed to a seed crystal rod in any orientation and descended from the top of a crystal growing furnace. The seed crystal was preheated for 30 minutes and then descended underneath the surface of the mixed melt liquid of barium tetraborate and flux. The mixed melt liquid was held at the temperature for 60 minutes and then quickly cooled to 690° C.

The mixed melt liquid was slowly cooled down at a rate of 2° C./day. The seed crystal rod was rotated at a rotation speed of 100 rpm to allow for crystal growth. When the monocrystal stopped growing, the crystal was drawn out of the liquid surface, and cooled to room temperature at a rate of 10° C./h. The crystal was then taken out from the furnace to obtain a barium tetraborate $BaB_4O_7$ non-linear optical crystal at a size of 27 mm×24 mm×13 mm.

The barium-containing compound can be substituted by $BaCO_3$, $Ba(OH)_2$, $Ba(NO_3)_2$ or $Ba(HCO_3)_2$, while boric acid can be substituted by boron trioxide.

Example 4

The $BaB_4O_7$ compound was prepared according to the reaction equation:

$$2Ba(NO_3)_2 + 8H_3BO_3 \rightarrow 2BaB_4O_7 + 4NO_2\uparrow + O_2\uparrow + 12H_2O\uparrow$$

and the specific operation as described in Example 1.

The barium tetraborate $BaB_4O_7$ compound synthesized was mixed with a flux $PbO$—$H_3BO_3$ at a molar ratio of $BaB_4O_7$:$PbO$—$H_3BO_3$=1:3. The mixture was charged into a Φ100 mm×100 mm open-mouth platinum crucible. The platinum crucible was heated to 750° C., held at this temperature for 50 hours, and then cooled to 700° C. to obtain a mixed melt liquid of barium tetraborate and flux, wherein the molar ratio of the flux was $PbO$:$H_3BO_3$=3:2.

The mixed melt liquid obtained was slowly cooled to room temperature at a rate of 7° C./h. The platinum wire suspension method was used during cooling to obtain a small crystal as the barium tetraborate $BaB_4O_7$ seed crystal.

The seed crystal obtained was fixed to a seed crystal rod in any orientation and descended from the top of a crystal growing furnace. The seed crystal was preheated for 35 minutes, and then descended underneath the surface of the mixed melt liquid of the barium tetraborate and flux. The mixed melt liquid was held at the temperature for 60 minutes and then quickly cooled to 690° C.

The mixed melt liquid was slowly cooled down at a rate of 5° C./day. The seed crystal rod was rotated at a rotation speed of 100 rpm to allow for crystal growth. When the monocrystal stopped growing, the crystal was drawn out of the liquid surface, and cooled to room temperature at a rate of 50° C./h. The crystal was then taken out from the furnace to obtain a barium tetraborate $BaB_4O_7$ non-linear optical crystal at a size of 19 mm×15 mm×8 mm.

The barium-containing compound can be substituted by $BaCO_3$, $Ba(OH)_2$, $BaO$ or $Ba(HCO_3)_2$, while boric acid can be substituted by boron trioxide.

Example 5

The $BaB_4O_7$ compound was prepared according to the reaction equation:

$$Ba(HCO_3)_2 + 4H_3BO_3 \rightarrow BaB_4O_7 + 2CO_2\uparrow + 7H_2O\uparrow$$

and the specific operation as described in Example 1.

The barium tetraborate $BaB_4O_7$ compound synthesized was mixed with a flux $PbO$—$PbF_2$ at a molar ratio of $BaB_4O_7$:$PbO$—$PbF_2$=1:6. The mixture was charged into a Φ80 mm×80 mm open-mouth platinum crucible. The platinum crucible was heated to 720° C., held at this temperature for 70 hours, and then cooled to 650° C. to obtain a mixed melt liquid of barium tetraborate and flux, wherein the molar ratio of the flux was $PbO$:$PbF_2$=3:1.

The mixed melt liquid obtained was slowly cooled to room temperature at a rate of 8° C./h, allowing for crystallization to obtain a small crystal as the barium tetraborate $BaB_4O_7$ seed crystal.

The seed crystal obtained was fixed to a seed crystal rod in any orientation and descended from the top of a crystal growing furnace. The seed crystal was preheated for 50 minutes and then descended underneath the surface of the mixed melt liquid of barium tetraborate and flux. The mixed melt liquid was held at the temperature for 40 minutes and then quickly cooled to 640° C.

The mixed melt liquid was slowly cooled down at a rate of 1.5° C./day. The seed crystal rod was rotated at a rotation speed of 40 rpm to allow for crystal growth. When the monocrystal stopped growing, the crystal was drawn out of the liquid surface, and cooled to room temperature at a rate of 70° C./h. The crystal was then taken out from the furnace to obtain a barium tetraborate $BaB_4O_7$ non-linear optical crystal at a size of 34 mm×28 mm×19 mm.

The barium-containing compound can be substituted by $BaCO_3$, $Ba(OH)_2$, $BaO$ or $Ba(NO_3)_2$, while boric acid can be substituted by boron trioxide.

Example 6

The $BaB_4O_7$ compound was prepared according to the reaction equation:

$$BaCO_3 + 2B_2O_3 \rightarrow BaB_4O_7 + CO_2\uparrow$$

and the specific operation as described in Example 1.

The barium tetraborate $BaB_4O_7$ compound synthesized was mixed with a flux $PbF_2$—$H_3BO_3$ at a molar ratio of $BaB_4O_7$:$PbF_2$—$H_3BO_3$=1:5. The mixture was charged into a Φ60 mm×60 mm open-mouth platinum crucible. The platinum crucible was heated to 780° C., held at this temperature for 60 hours, and then cooled to 730° C. to obtain a mixed melt liquid of barium tetraborate and flux, wherein the molar ratio of the flux was $PbF_2$:$H_3BO_3$=1:4.

The mixed melt liquid obtained was slowly cooled to room temperature at a rate of 5.5° C./h. The platinum wire suspension method was used during cooling to obtain a small crystal as the barium tetraborate $BaB_4O_7$ seed crystal.

The seed crystal obtained was fixed to a seed crystal rod in any orientation and descended from the top of a crystal growing furnace. The seed crystal was preheated for 40 minutes, and then descended underneath the surface of the mixed melt liquid of barium tetraborate and flux. The mixed melt liquid was held at the temperature for 20 minutes and then quickly cooled to 720° C.

The mixed melt liquid was slowly cooled down at a rate of 0.1° C./day. The seed crystal rod was rotated at a rotation speed of 30 rpm to allow for crystal growth. When the monocrystal stopped growing, the crystal was drawn out of the liquid surface, and cooled to room temperature at a rate of 20° C./h. The crystal was then taken out from the furnace to obtain a barium tetraborate $BaB_4O_7$ non-linear optical crystal at a size of 38 mm×27 mm×24 mm.

The barium-containing compound can be substituted by $Ba(HCO_3)_2$, $Ba(OH)_2$, $BaO$ or $Ba(NO_3)_2$, while boron trioxide can be substituted by boric acid.

Example 7

The $BaB_4O_7$ compound was prepared according to the reaction equation:

$$Ba(OH)_2 + 2B_2O_3 \rightarrow BaB_4O_7 + H_2O\uparrow$$

and the specific operation as described in Example 1.

The barium tetraborate $BaB_4O_7$ compound synthesized was mixed with a flux $PbF_2$—$H_3BO_3$ at a molar ratio of $BaB_4O_7$:$PbF_2$—$H_3BO_3$=1:5. The mixture was charged into a Φ70 mm×70 mm open-mouth platinum crucible. The platinum crucible was heated to 770° C., held at this temperature for 90 hours, and then cooled to 710° C. to obtain a mixed melt liquid of barium tetraborate and flux, wherein the molar ratio of the flux was $PbF_2$:$H_3BO_3$=2:3.

The mixed melt liquid obtained was slowly cooled to room temperature at a rate of 3.5° C./h, allowing for crystallization to obtain a small crystal as the barium tetraborate $BaB_4O_7$ seed crystal.

The seed crystal obtained was fixed to a seed crystal rod in any orientation and descended from the top of a crystal growing furnace. The seed crystal was preheated for 10 minutes and then descended underneath the surface of the mixed melt liquid of barium tetraborate and flux. The mixed melt liquid was held at the temperature for 40 minutes and then quickly cooled to 700° C.

The mixed melt liquid was slowly cooled down at a rate of 10° C./day. The seed crystal rod was rotated at a rotation speed of 5 rpm to allow for crystal growth. When the monocrystal stopped growing, the crystal was drawn out of the liquid surface, and cooled to room temperature at a rate of 5° C./h. The crystal was then taken out from the furnace to obtain a barium tetraborate $BaB_4O_7$ non-linear optical crystal at a size of 15 mm×13 mm×8 mm.

The barium-containing compound can be substituted by $Ba(HCO_3)_2$, $BaCO_3$, $BaO$ or $Ba(NO_3)_2$, while boron trioxide can be substituted by boric acid.

Example 8

The $BaB_4O_7$ compound was prepared according to the reaction equation:

$$BaO + 2B_2O_3 \rightarrow BaB_4O_7$$

and the specific operation as described in Example 1.

The barium tetraborate $BaB_4O_7$ compound synthesized was mixed with a flux $NaF$—$H_3BO_3$ at a molar ratio of $BaB_4O_7$:$NaF$—$H_3BO_3$=2:5. The mixture was charged into a Φ50 mm×50 mm open-mouth platinum crucible. The platinum crucible was heated to 800° C., held at this temperature for 20 hours, and then cooled to 740° C. to obtain a mixed melt liquid of barium tetraborate and flux, wherein the molar ratio of the flux was $NaF$—$H_3BO_3$=4:3.

The mixed melt liquid obtained was slowly cooled to room temperature at a rate of 7° C./h. The platinum wire suspension method was used during cooling to obtain a small crystal as the barium tetraborate $BaB_4O_7$ seed crystal.

The seed crystal obtained was fixed to a seed crystal rod in any orientation and descended from the top of a crystal growing furnace. The seed crystal was preheated for 25 minutes, and then descended underneath the surface of the mixed melt liquid of barium tetraborate and flux. The mixed melt liquid was held at this temperature for 30 minutes and then quickly cooled to 730° C.

The mixed melt liquid was cooled down at a rate of 1.5° C./day. The seed crystal rod was rotated at a rotation speed of 55 rpm to allow for crystal growth. When the monocrystal stopped growing, the crystal was drawn out of the liquid surface, and cooled to room temperature at a rate of 35° C./h. The crystal was then taken out from the furnace to obtain a barium tetraborate $BaB_4O_7$ non-linear optical crystal at a size of 22 mm×17 mm×11 mm.

The barium-containing compound can be substituted by $Ba(HCO_3)_2$, $BaCO_3$, $Ba(OH)_2$ or $Ba(NO_3)_2$, while boron trioxide can be substituted by boric acid.

Example 9

The $BaB_4O_7$ compound was prepared according to the reaction equation:

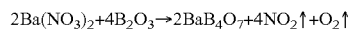

$$2Ba(NO_3)_2 + 4B_2O_3 \rightarrow 2BaB_4O_7 + 4NO_2\uparrow + O_2\uparrow$$

and the specific operation as described in Example 1.

The barium tetraborate $BaB_4O_7$ compound synthesized was mixed with a flux $PbO—H_3BO_3$ at a molar ratio of $BaB_4O_7:PbO—H_3BO_3=1:1$. The mixture was charged into a Φ90 mm×90 mm open-mouth platinum crucible. The platinum crucible was heated to 750° C., held at this temperature for 70 hours, and then cooled to 690° C. to obtain a mixed melt liquid of barium tetraborate and flux, wherein the molar ratio of the flux was $PbO—H_3BO_3=5:4$.

The mixed melt liquid obtained was slowly cooled to room temperature at a rate of 7.5° C./h, allowing for crystallization to obtain a small crystal as the barium tetraborate $BaB_4O_7$ seed crystal.

The seed crystal obtained was fixed to a seed crystal rod in any orientation and descended from the top of a crystal growing furnace. The seed crystal was preheated for 45 minutes and then descended underneath the surface of the mixed melt liquid of barium tetraborate and flux. The mixed melt liquid was held at the temperature for 20 minutes and then quickly cooled to 680° C.

The mixed melt liquid was slowly cooled down at a rate of 2.5° C./day. The seed crystal rod was rotated at a rotation speed of 80 rpm to allow for crystal growth. When the monocrystal stopped growing, the crystal was drawn out of the liquid surface, and cooled to room temperature at a rate of 60° C./h. The crystal was then taken out from the furnace to obtain a barium tetraborate $BaB_4O_7$ non-linear optical crystal at a size of 38 mm×26 mm×19 mm.

The barium-containing compound can be substituted by $Ba(HCO_3)_2$, $BaCO_3$, $Ba(OH)_2$ or BaO, while boron trioxide can be substituted by boric acid.

Example 10

The $BaB_4O_7$ compound was prepared according to the reaction equation:

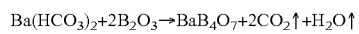

$$Ba(HCO_3)_2 + 2B_2O_3 \rightarrow BaB_4O_7 + 2CO_2\uparrow + H_2O\uparrow$$

and the specific operation as described in Example 1.

The barium tetraborate $BaB_4O_7$ compound synthesized was mixed with a flux $PbO—PbF_2$ at a molar ratio of $BaB_4O_7:PbO—PbF_2=1:3$. The mixture was charged into a Φ60 mm×60 mm open-mouth platinum crucible. The platinum crucible was heated to 780° C., held at this temperature for 30 hours, and then cooled to 720° C. to obtain a mixed melt liquid of barium tetraborate and flux, wherein the molar ratio of the flux was $PbO—PbF_2=1:4$.

The mixed melt liquid obtained was slowly cooled to room temperature at a rate of 8° C./h. The platinum wire suspension method was used during cooling to obtain a small crystal as the barium tetraborate $BaB_4O_7$ seed crystal.

The seed crystal obtained was fixed to a seed crystal rod in any orientation and descended from the top of a crystal growing furnace. The seed crystal was preheated for 15 minutes and then descended underneath the surface of the mixed melt liquid of barium tetraborate and flux. The mixed melt liquid was held at the temperature for 50 minutes and then quickly cooled to 710° C.

The mixed melt liquid was slowly cooled down at a rate of 0.5° C./day. The seed crystal rod was rotated at a rotation speed of 5 rpm to allow for crystal growth. When the monocrystal stopped growing, the crystal was drawn out of the liquid surface, and cooled to room temperature at a rate of 10° C./h. The crystal was then taken out from the furnace to obtain a barium tetraborate $BaB_4O_7$ non-linear optical crystal at a size of 18 mm×12 mm×9 mm.

The barium-containing compound can be substituted by $Ba(NO_3)_2$, $BaCO_3$, $Ba(OH)_2$ or BaO, while boron trioxide can be substituted by boric acid.

Example 11

Figure 2:
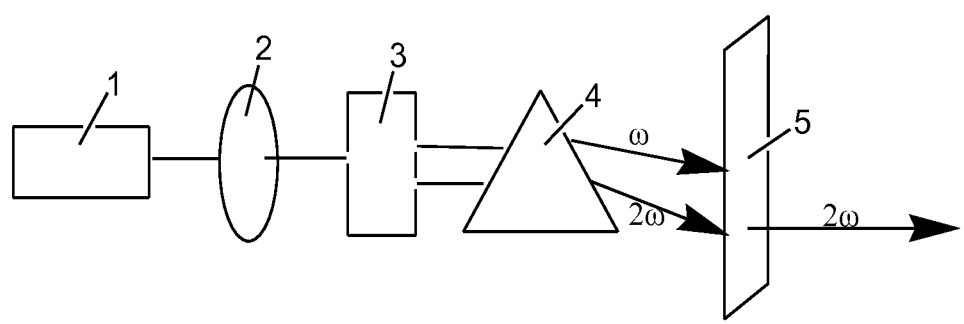
FIG. 2 is a diagram of working principle of the barium tetraborate crystal non-linear optical device of the present invention, wherein 1 is a laser generator, 2 is a convex lens, 3 is the barium tetraborate non-linear optical crystal, 4 is a beam splitter prism and 5 is a filter, and ω is refracted light frequency, equal to incident light frequency or 2 times as much as incident light frequency.

Any one of the crystals obtained in Examples 1-10 was arranged at the position (3) as shown in FIG. 2. At room temperature, when a Q-switched Nd:YAG laser generator, setting at 1,064 nm, was used as light source, it was observed that clear frequency-doubled green light in 532 nm was output, the output intensity of which was equivalent to twice of that of KDP. As shown in FIG. 2, Q-switched Nd:YAG laser generator 1 emitted an infrared light at a wavelength of 1,064 nm, which then entered the $BaB_4O_7$ non-linear optical crystal after passing through the convex lens 2, and then a frequency-doubled green light at a wavelength of 532 nm was generated. The output light beam from dispersion prism 4 comprised both the infrared light at a wavelength of 1,064 nm and the green light at wavelength of 532 nm. After filtration by filter 5, the frequency-doubled light at a wavelength of 532 nm was obtained.

The invention claimed is:

1. A barium tetraborate compound, wherein the compound has a chemical formula of $BaB_4O_7$ and a molecular weight of 292.58, the compound has a non-centrosymmetric structure, belongs to a hexagonal crystal system, has a space group $P6_5$, with lattice parameters of a=6.7233(6) Å, c=18.776(4) Å, V=735.01(17) Å$^3$ and Z=6.

2. A barium tetraborate non-linear optical crystal, wherein the crystal has a chemical formula of $BaB_4O_7$ and a molecular weight of 292.58, the crystal is non-centrosymmetric, belongs to a hexagonal crystal system, has a space group $P6_5$, with lattice parameters of a=6.7233(6) Å, c=18.776(4) Å, V=735.01(17) Å$^3$ and Z=6.

3. A preparation method of the barium tetraborate non-linear optical crystal according to claim 2, wherein a high temperature solution method is utilized for the crystal growth, and the method comprises the following steps:

a. a single-phase polycrystalline powder of the barium tetraborate prepared by a solid-phase reaction method is uniformly mixed with a flux to obtain a mixture; the mixture is heated to 720-820° C. at a rate of 1-50° C./h and held at this temperature for 1-100 hours to obtain a mixed melt liquid, which is then cooled to 650-750° C. to obtain a mixed melt liquid of barium tetraborate and flux;

b. the mixed melt liquid obtained in Step (a) is slowly cooled to room temperature at a rate of 0.5-10° C./h, allowing for crystallization to obtain a seed crystal, or using a platinum wire suspension method during cooling to obtain a small crystal as barium tetraborate seed crystal;

c. the seed crystal obtained in Step (b) is fixed to a seed crystal rod and descended from a top of a crystal growing furnace, the seed crystal is preheated for 5-60 minutes, and then descended underneath the mixed melt liquid of barium tetraborate and flux to allow for meltback, and mixed melt liquid held at a constant temperature for 5-60 minutes, and then cooled to 640-740° C.;

d. the mixed melt liquid is cooled down at a rate of 0.1-5° C./day; the seed crystal rod is rotated at a rotation speed of 0-100 rpm to allow for crystal growth; when a monocrystal is grown to a desired size, the crystal is drawn out of a liquid surface, and cooled to room temperature at a rate of 1-100° C./h; the crystal is then taken out from the furnace to obtain the barium tetraborate non-linear optical crystal;

in Step (a), a molar ratio of the barium tetraborate to the flux is 1:1-6;

said flux is $PbF_2$—$H_3BO_3$, $BaF_2$—$H_3BO_3$, NaF—$H_3BO_3$, PbO—$H_3BO_3$ or PbO—$PbF_2$; in said flux $PbF_2$—$H_3BO_3$, $BaF_2$—$H_3BO_3$, NaF—$H_3BO_3$ and PbO—$H_3BO_3$, a molar ratio of $PbF_2$, $BaF_2$, NaF or PbO to $H_3BO_3$ is 1-6:1-4, and in said flux PbO—$PbF_2$, a molar ratio of PbO to $PbF_2$ is 1-3:1-4.

4. The preparation method of the barium tetraborate non-linear optical crystal according to claim 3, wherein the barium tetraborate in Step (a) is substituted by a barium-containing compound, and said barium-containing compound is $BaCO_3$, $Ba(OH)_2$, BaO, $Ba(NO_3)_2$ or $Ba(HCO_3)_2$.

5. The preparation method of the barium tetraborate non-linear optical crystal according to claim 3, the seed crystal in Step (c) is fixed to the seed crystal rod in any orientation.

6. A use of the barium tetraborate non-linear optical crystal according to claim 2, wherein the crystal is used to prepare a frequency doubling generator, an upper frequency converter, a lower frequency converter or an optical parametric oscillator.

* * * * *